(12) United States Patent
Wu et al.

(10) Patent No.: US 8,903,027 B1
(45) Date of Patent: Dec. 2, 2014

(54) DETECTOR FOR A MULTIPLE-ANTENNA RECEIVER

(75) Inventors: Michael Wu, Palo Alto, CA (US); Christopher H. Dick, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 457 days.

(21) Appl. No.: 13/170,004

(22) Filed: Jun. 27, 2011

(51) Int. Cl.
*H04L 27/06* (2006.01)
*H03M 13/03* (2006.01)

(52) U.S. Cl.
USPC .......................................... 375/341; 714/794

(58) Field of Classification Search
CPC ....................... H04L 1/0631; H04L 25/03242
USPC .......... 375/316, 340, 341; 714/699, 746, 786, 714/794
See application file for complete search history.

(56) References Cited

U.S. PATENT DOCUMENTS

| | | | |
|---|---|---|---|
| 8,064,548 B2 * | 11/2011 | Sundberg et al. | 375/341 |
| 8,428,173 B2 * | 4/2013 | Lin et al. | 375/267 |
| 8,719,658 B2 | 5/2014 | Cui et al. | |
| 2003/0076890 A1 * | 4/2003 | Hochwald et al. | 375/264 |
| 2005/0138520 A1 | 6/2005 | Richardson | |
| 2008/0279298 A1 * | 11/2008 | Ben-Yishai et al. | 375/261 |
| 2010/0014606 A1 * | 1/2010 | Chen et al. | 375/262 |
| 2011/0320902 A1 | 12/2011 | Gunnam | |
| 2012/0204081 A1 | 8/2012 | Fresia et al. | |
| 2013/0151911 A1 | 6/2013 | Dick et al. | |

FOREIGN PATENT DOCUMENTS

| | | |
|---|---|---|
| EP | 1 906 610 A1 | 4/2008 |
| WO | WO 2005/064800 A1 | 7/2005 |

OTHER PUBLICATIONS

Ketonen, Johanna et al., "MIMO Detection in Single Carrier Systems," *Proc. of the 19th European Signal Processing Conference*, Aug. 29, 2011, pp. 654-658, European Association for Signal Processing (EURASIP).
Studer, Christoph et al., "Implementation Trade-offs of Soft-Input Soft-Output MAP Decoders for Convolutional Codes," Rice University Online Repository, Feb. 14, 2012, pp. 1-10, http://www.ece.rice.edu/~cs32/papers/12TCAS_bcjrtradeoffs.pdf.
Valenti, Matthew, *Turbo Codes and Iterative Processing*, Washington State University Online Repository, Nov. 30, 1998, pp. 1-18, http://www.csee.wvu.edu/~mvalenti/documents/NZWCS.PPT.
U.S. Appl. No. 12/059,731, filed Mar. 31, 2008, Jones et al.
U.S. Appl. No. 12/233,320, filed Sep. 18, 2008, Stirling et al.

(Continued)

*Primary Examiner* — Vineeta Panwalkar
(74) *Attorney, Agent, or Firm* — W. Eric Webostad; Lois D. Cartier

(57) ABSTRACT

An embodiment of a method for a multiple-antenna receiver is disclosed. For this embodiment of the method, a detector obtains a channel matrix and a symbol vector. Contents of the channel matrix and the symbol vector are accessed in order and out of order, where the out of order access of the contents of the channel matrix and the symbol vector respectively provide a reordered channel matrix and a reordered symbol vector. The channel matrix is decomposed with the symbol vector to obtain first decomposition inputs. The reordered channel matrix is decomposed with the reordered symbol vector to obtain second decomposition inputs. The first decomposition inputs are sphere detected to provide first candidates. The second decomposition inputs are sphere detected to provide second candidates. Reliability information is generated from the first candidates and the second candidates.

18 Claims, 11 Drawing Sheets

(56) References Cited

OTHER PUBLICATIONS

Amiri, Kiarash et al., "Flex-Sphere: An FPGA Configurable Sort-Free Sphere Detector for Multi-user MIMO Wireless Systems," *Proc. of the SDR '08 Technical Conference and Product Exposition*, Oct. 26, 2008, pp. 1-7, available from the Wireless Innovation Forum at www.wirelessinnovation.org.

Barbero, Luis G. et al., "A Fixed-Complexity MIMO Detector Based on the Complex Sphere Decoder," *Proc. of the IEEE 7th Workshop on Signal Processing Advances in Wireless Communications*, Jul. 2, 2006, pp. 1-5, IEEE, Piscataway, New Jersey, USA.

Berrou, Claude et al., "Near Shannon Limit Error-Correcting Coding and Decoding: Turbo-Codes (1)," *Proc. of the IEEE International Conference on Communications*, May 23, 1993, pp. 1064-1070, vol. 2, Issue 1, IEEE, Piscataway, New Jersey, USA.

Bhargave, Ashish et al., "A New MIMO Detector for Iterative Decoding with Multiple Antenna Systems," *Proc. of the 2005 Military Communications Conference*, Oct. 17, 2005, pp. 1-5, IEEE, Piscataway, New Jersey, USA.

Burg, Andreas et al., "VLSI Implementation of MIMO Detection Using the Sphere Decoding Algorithm," *IEEE Journal of Solid-State Circuits*, Jul. 2005, pp. 1566-1577, IEEE, Piscataway, New Jersey, USA.

Burg, A. et al., "VLSI Implementation of the Sphere Decoding Algorithm," *Proc. of the 30th European Solid-State Circuits Conference*, Sep. 21, 2004, pp. 303-306, IEEE, Piscataway, New Jersey, USA.

Chan, Albert M. et al., "A New Reduced-Complexity Sphere Decoder for Multiple Antenna Systems," *Proc. of the 2002 IEEE International Conference on Communications*, Apr. 28, 2002, pp. 460-464, IEEE, Piscataway, New Jersey, USA.

Dai, Yongmei, "A Comparative Study of QRD-M Detection and Sphere Decoding for MIMO-OFDM Systems," *Proc. of the 2005 IEEE 16th International Symposium on Personal, Indoor and Mobile Radio Communications*, Sep. 11, 2005, pp. 186-190, IEEE, Piscataway, New Jersey, USA.

Dai, Yongmei et al., "Performance Comparison Between Coded V-Blast and GSTTC MIMO-OFDM Systems," *Proc. of the 2004 IEEE 15th International Symposium on Personal, Indoor and Mobile Radio Communications*, Sep. 5, 2004, pp. 2581-2585, Vol, 4, IEEE, Piscataway, New Jersey, USA.

Gross, Warren J., "VLSI Architecture for the Forward-Backward Algorithm," Jan. 1999, pp. 1-91, available from the University of Toronto Research Repository at http://tspace.library.utoronto.ca.

Guo, Zhan et al., "A 53.3 Mb/s 4×4 16-QAM MIMO Decoder in 0.35-µm CMOS," *Proc. of the 2005 International Symposium on Circuits and Systems*, May 23, 2005, pp. 4947-4950, IEEE, Piscataway, New Jersey, USA.

Langton, Charan, *Turbo decoding using the MAP Algorithm*, Tutorial 24, Part 2, Jan. 1, 2006, available at http://www.complextoreal.com.

Myllylä, Markus et al., "A List Sphere Detector Based on Dijkstra's Algorithm for MIMO-OFDM Systems," *Proc. of the 18th Annual IEEE International Symposium on Personal, Indoor and Mobile Radio Communications*, Sep. 3, 2007, pp. 1-5, IEEE, Piscataway, New Jersey, USA.

Noguera, Juanjo et al., "Wireless MIMO Sphere Detector Implemented in FPGA," *Xcell Journal*, Jan. 1, 2011, pp. 38-45, Issue 74, Xilinx, Inc., San Jose, California, USA.

Razavizadeh, S. Mohhamad et al., "A New Faster Sphere Decoder for MIMO Systems," *Proc. of the 3rd IEEE International Symposium on Signal Processing and Information Technology*, Dec. 14, 2003, pp. 86-89, IEEE, Piscataway, New Jersey, USA.

Ryan, William E., "A Turbo Code Tutorial," Jan. 1, 1997, pp. 1-9, available at http://www2.engr.arizona.edu/~ryan/.

Stojnic, M. et al., "A Branch and Bound Approach to Speed Up the Sphere Decoder" *Proc. of the 2005. IEEE International Conference on Acoustics, Speech, and Signal Processing*, Mar. 18, 2005, pp. iii-429 to iii-432, vol. 3, IEEE, Piscataway, New Jersey, USA.

Su, Karen et al., "A New Ordering for Efficient Sphere Decoding," *Proc. of the 2005 International Conference on Communications*, May 16, 2005, pp. 1906-1910, vol. 3, IEEE, Piscataway, New Jersey, USA.

vashe.org, *Turbo Code Primer*, Jul. 4, 2005, pp. 1-14, available at http://vashe.org.

Widdup, Benjamin et al., "A Highly-Parallel VLSI Architecture for a List Sphere Detector," *Proc. of the 2004 IEEE Conference on Communications*, Jun. 20, 2004, pp. 2720-2725, vol. 5, IEEE, Piscataway, New Jersey, USA.

Yang, Chia-Hsiang et al., "A Flexible VLSI Architecture for Extracting Diversity and Spatial Multiplexing Gains in MIMO Channels," *Proc. of the 2008 IEEE International Conference on Communications*, May 19, 2008, pp. 725-731, IEEE, Piscataway, New Jersey, USA.

U.S. Appl. No. 13/587,794, filed Aug. 16, 2012, Dick.

Langton, Charan, *Turbo Coding and MAP Decoding*, Tutorial 24, Part 1, Jan. 1, 2006, available at http://www.complextoreal.com.

\* cited by examiner

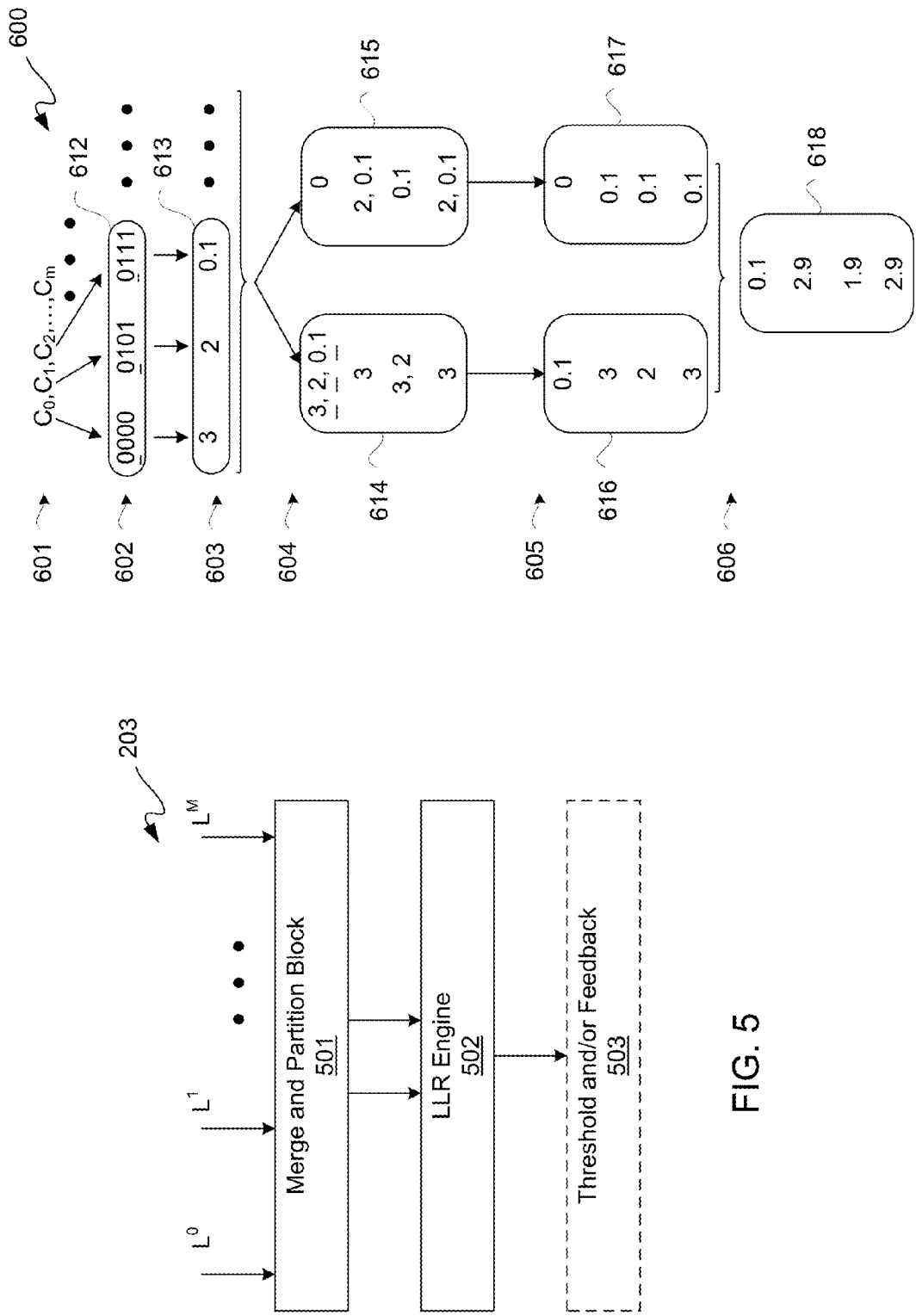

DETECTOR FOR A MULTIPLE-ANTENNA RECEIVER

FIELD OF THE INVENTION

An embodiment of the invention relates to integrated circuit devices ("ICs"). More particularly, an embodiment of the invention relates to a detector for a multiple-antenna receiver for an IC.

BACKGROUND

Multiple-input, multiple-output ("MIMO") receiver-side processing for broadband wireless may involve symbol detecting before decoding. A detector may be positioned in front of a decoder for symbol detection prior to decoding. Accordingly, it would be desirable and useful to provide a detector that provides symbol detection information to enhance decoding accuracy.

SUMMARY

One or more embodiments generally relate to a detector for a multiple-antenna receiver for an IC.

An embodiment relates generally to a method for a multiple-antenna receiver. A detector obtains a channel matrix and a symbol vector. Contents of the channel matrix and the symbol vector are accessed in order and out of order, where the out of order access of the contents of the channel matrix and the symbol vector respectively provide a reordered channel matrix and a reordered symbol vector. The channel matrix is decomposed with the symbol vector to obtain first decomposition inputs. The reordered channel matrix is decomposed with the reordered symbol vector to obtain second decomposition inputs. The first decomposition inputs are sphere detected to provide first candidates. The second decomposition inputs are sphere detected to provide second candidates. Reliability information is generated from the first candidates and the second candidates, and the reliability information is output.

Another embodiment relates generally to a detector system. In such an embodiment, channel reordering and decomposing circuits are each coupled to receive a channel matrix and a symbol vector as inputs. The channel reordering and decomposing circuits are respectively coupled to receive control signals. Sphere detectors are respectively coupled to receive outputs from the channel reordering and decomposing circuits to respectively generate lists of candidates. A reliability information generator is coupled to receive the lists of candidates for generating reliability information associated with symbols of a constellation.

Yet another embodiment relates generally to another embodiment of a detector system. In such an embodiment, a channel reordering and decomposing circuit is coupled to receive a channel matrix and a symbol vector as inputs. An address sequencer is coupled to the channel reordering and decomposing circuit to provide a sequence of addresses thereto. A sphere detector is coupled to receive output from the channel reordering and decomposing circuit to generate a list of candidates. A reliability information generator is coupled to receive the list of candidates for generating reliability information associated with symbols of a constellation.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

FIG. 5 is a block diagram depicting an exemplary embodiment of a log-likelihood ratio ("LLR") generator.

FIG. 6 is a flow diagram depicting an exemplary embodiment of an LLR generation flow.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
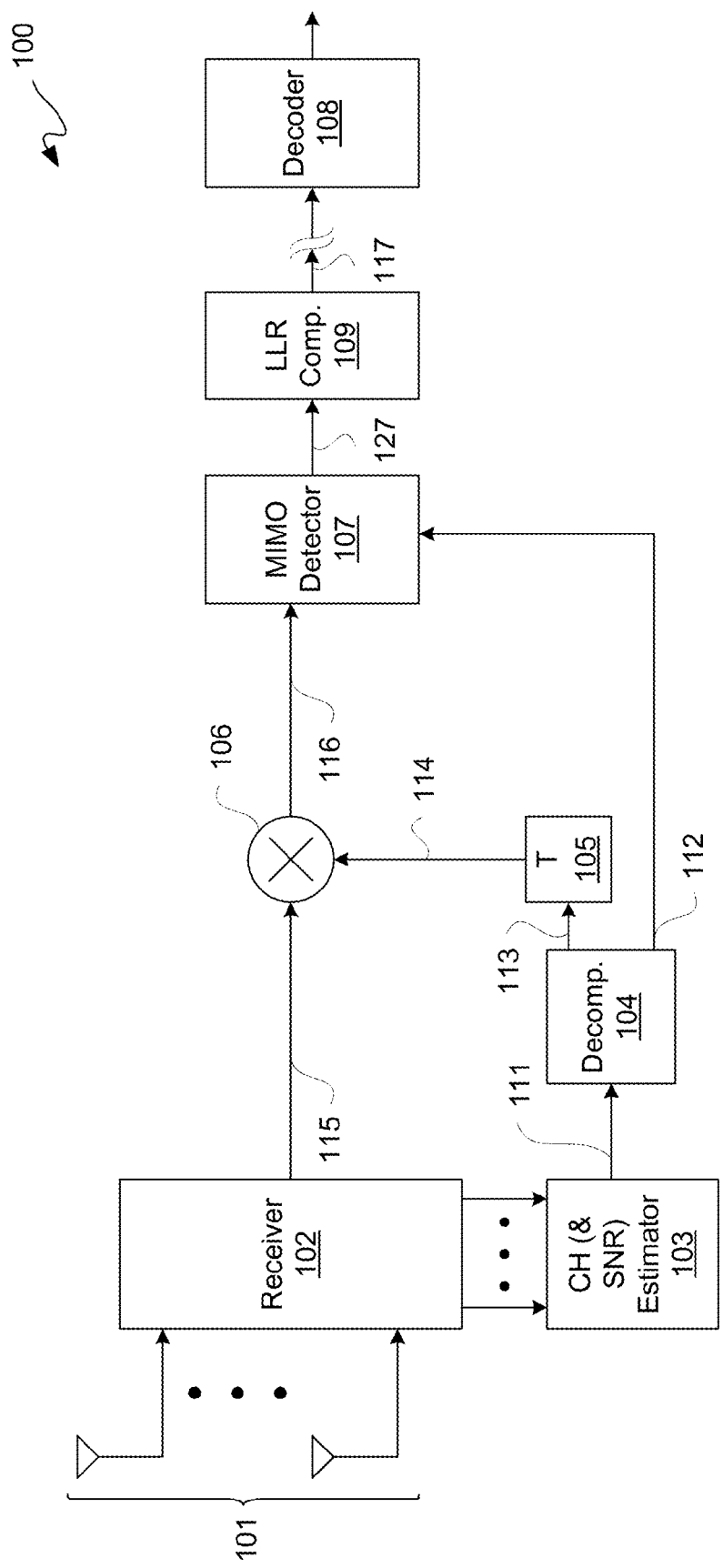
FIG. 1 is a block diagram depicting an exemplary embodiment of a receiver-side of a communication system.

FIG. 1 is a block diagram depicting an exemplary embodiment of a receiver-side of a communication system 100. System 100 includes a plurality of antennas 101, a receiver 102, eight channel estimator 103, a decompose block 104, a transpose block 105, a multiplier 106, a detector 107, a decoder 108, and reliability information "soft" output generator 109, such as a log likelihood ratio ("LLR") computation block 109. As used herein, "include" and "including" mean including without limitation. System 100 may be for a receiver side of multiple-input multiple-output ("MIMO") communication system. Accordingly, for purposes of clarity by way of example and not limitation, detector 107 is referred to herein as a MIMO detector even though such detector may be used in other types of communication systems.

In this exemplary embodiment, the number of receive antennas 101 is greater than or equal to a number of transmit antennas. For this exemplary embodiment, it shall be assumed that there are N antennas 101, for N an integer greater than one. Antennas 101 may receive signals, such as orthogonal frequency division multiplexing ("OFDM") signals, for input to receiver 102. Receiver 102 may output a received signal 115, y, where y is a listing of received signal components from antennas 101, namely $y=[y_0, y_1 \ldots y_{N-1}]$. Received signal y 115 is a symbol vector.

It should be understood that even though for purposes of clarity and not limitation single lines with arrows are shown in some instances, as well as single instances of some components, it should be understood in use there may be multiple instances of such lines, as well as such components. For example, a parallel-to-serial ("P/S") converter may receive parallel output from MIMO detector 107 for conversion to serial input, such as to a de-interleaver, prior to input to decoder 108. Accordingly, it should be understood that signal processing between receiver 102 and such a P/S converter may be performed in parallel. Furthermore, it should be understood that in other embodiments, there a P/S converter may follow decoder 108, and thus there may be multiple instances of de-interleavers and decoders following MIMO detector 107.

Channel estimator 103 may be coupled to receiver 102. Channel estimator 103 receives information from antennas 101 via receiver 102 for providing a channel matrix 111, H. Channel matrix H 111 is provided as an input to decompose block 104. In this exemplary embodiment, decompose block 104 is for a QR decomposition. QR decompose block 104 has an output 113 Q which is a unitary matrix and output 112 R which is an upper triangular matrix. In other words, outputs 113 and 112 from QR decompose block 104 are a unitary matrix Q and an upper triangular matrix R, respectively, for a channel matrix H input 111. Unitary matrix Q 113 is provided as an input to transpose block 105, and output of transpose block 105 is a transposed unitary matrix $Q^T$ 114.

Transposed unitary matrix $Q^T$ 114 is provided as an input to multiplier 106. Another input to multiplier 106 is symbol vector y 115. Output of multiplier 106 is a symbol vector 116, ŷ, where ŷ=Rx+n where n is generally for noise received via antennas 101, namely $n=[n_0, n_1 \ldots n_{N-1}]$ and x is generally a symbol vector received via antennas 101, namely $x=[x_0, x_1 \ldots x_{N-1}]$. In short, x is transmitted from a transmitter but is distorted by noise n and scaled by R. Because R is known from H, and ŷ is known as received, a transmitted symbol vector x is to be resolved in view of noise n.

MIMO detector 107 receives upper triangular matrix R 112 and symbol vector ŷ 116 as inputs to provide sphere detected candidates output 127. MIMO detector 107 using sphere detecting generates sphere detected candidates output 127. In this exemplary embodiment, sphere detected candidates output 127 is provided to an LLR computation block 109 to provide log likelihood ratios ("LLRs") output 117, namely generally reliability information, as soft outputs. Soft outputs, such as LLRs, are described below in additional detail.

LLR computation block 109 may be coupled to decoder 108 for providing LLRs output 117 to decoder 108. Decoder 108 may be a Turbo decoder for example. However, decoder 108 may be another type of decoder, such as for example a low-density parity-check code ("LDPC") decoder, a Viterbi decoder, or any other type of decoder capable of using reliability information from a detector as described herein. Additionally, there may be other blocks coupled between MIMO detector 107 and decoder 108, such as a de-interleaver and/or a parallel-to-serial converter, among others.

As described below in additional detail, MIMO detector 107 uses one or more soft output sphere detectors that avoid introduction of LLR clipping. Thus determining clipping thresholds for LLR computations may be avoided. Moreover, LLR clipping, which can degrade numerical quality of resulting LLR values, may likewise be avoided.

Performance of sphere detectors may allow for near-maximum likelihood ("near-ML") detection. Furthermore, use of one or more of such sphere detectors may reduce computational complexity on the receiving side of a MIMO communication system. Example broadband wireless technologies using MIMO processing may include 3GPP LTE, WiMAX, 3G WCDMA, and 802.11n, among others. It should be understood that a receiving side of a MIMO communication system may include a base station, notebook computer, and/or a mobile device (e.g., a smart phone, personal data assistant, and the like), among other devices.

For purposes of clarity by way of example and not limitation, it shall be assumed that Turbo codes are used for the exemplary embodiment of FIG. 1. Because soft-input soft-output channel coding, such as Turbo codes, are used in many channel coding protocols for wireless systems, and because a MIMO detector is positioned forward of an MIMO decoder in a receiving side of such communication systems, sphere detectors that produce soft outputs may be useful. In other words, detectors that produce bit-level reliability information rather than a binary value may be useful. In the exemplary embodiment of FIG. 1, such soft values output as reliability information are LLRs. By reliability information, it should be understood that such information may indicate likelihood or probability of a detected event or item.

As described below in additional detail, a sphere detector may be reduced in complexity, namely computational overhead and/or hardware overhead, by using multiple copies or instances of such sphere detector, namely in effect multiple instances of a tree search. In the exemplary embodiment described with reference to FIG. 1, it is assumed that the number of transmit antennas equals the number of receive antennas even though the number of receive antennas in other embodiments may be greater than the number of transmit antennas. Thus, the number of copies or instances of a tree search may at least be equal to the number of transmit antennas M, namely M is less than or equal to N. In other words, quality of soft data output from a MIMO detector 107 is improved by scheduling sphere detecting to perform multiple sphere detections, such as for example M sphere detections. However, such M sphere detections are different from one another by permutating channel matrix H 111 and symbol vector y 115, as described below in additional detail.

Again, from the following description it should be understood that LLR clipping may be avoided, and thus limitations associated with LLR clipping may likewise be avoided. Furthermore, even though in an embodiment multiple detection paths may be implemented, it should be understood that the complexity associated with implementing LLR clipping is avoided by using such additional detection paths. Thus, even in such an embodiment, overall complexity may be reduced. Furthermore, quality of result of soft data output from MIMO detector 107 may be improved by scheduling multiple sphere detections.

Figure 2:
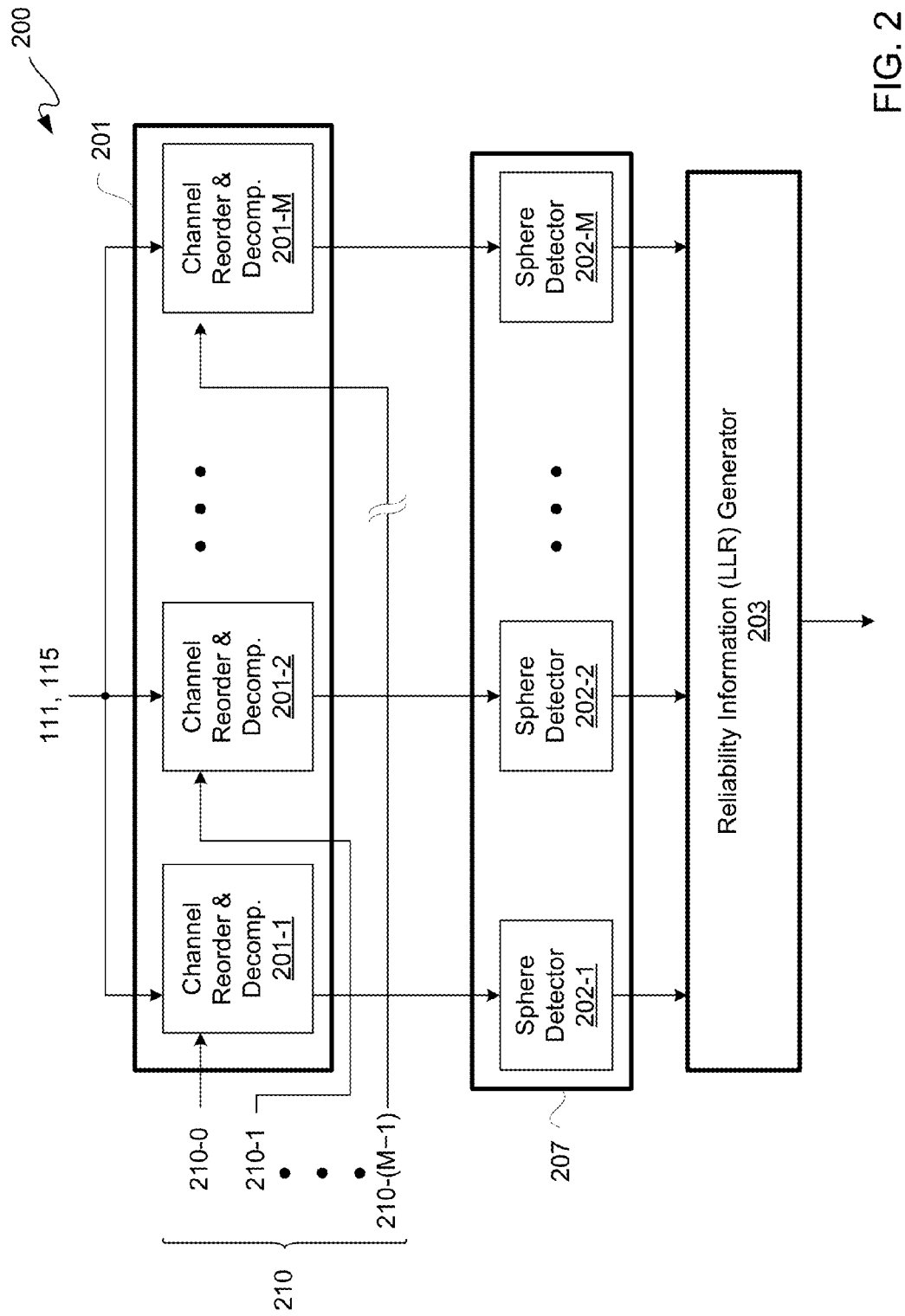
FIG. 2 is a block diagram depicting an exemplary embodiment of a parallel detection path multiple-input multiple-output ("MIMO") detector system with merger of candidate lists.

FIG. 2 is a block diagram depicting an exemplary embodiment of a parallel detection path MIMO detector system 200. MIMO detector system 200 includes a reliability information generator 203, channel reorder and decomposition blocks or circuits 201-1 through 201-M ("201"), and sphere detectors 202-1 through 202-M ("202"). Collectively, sphere detectors 202 provide a parallel detection path MIMO detector 207, which may be MIMO detector 107 of FIG. 1.

Reliability information generator 203 generates soft outputs. In this exemplary embodiment, reliability information generator 203 is an LLR generator, such as an LLR computation block 109 as in FIG. 1. However, it should be appreciated that other types of generators that provide probabilities or likelihoods may be used. Furthermore, channel reorder and decomposition blocks 201 may be a parallelized form of decompose block 104, transpose block 105, and multiplier 106 of FIG. 1.

Channel reorder and decomposition blocks 201 are respectively coupled in pairs. Thus for example, channel reorder and decomposition block 201-1 and sphere detector 202-1 form a pair of blocks for a detection path. Likewise, channel reorder in decomposition block 201-2 and sphere detector 202-2 form another pair of blocks for another detection path. In this exemplary embodiment, there are M detection paths.

Each channel reorder portion of blocks 201 receives channel matrix H 111 and symbol vector y 115 as inputs. Each channel reorder portion of blocks 201 receives a control signal, namely a set signal, of control signals 210. Set signals 210-0 through 210-(M−1) ("210") are respectively provided to channel reorders of blocks 201-1 through 201-M. Set signals 210 in this exemplary embodiment are used to select an initial row as associated with an antenna, such as antennas 101 of FIG. 1, from channel matrix H 111 and symbol vector y 115 for processing, as described below in additional detail.

A process used for sphere detection known as "Flexsphere" may be generally thought of as "a greedy" tree search. Flexsphere is a variant of a "K-best" process. Even though Flexsphere is described herein, it should be understood that other variants of K-best process or a K-best process may be used. However, for purposes of clarity by way of example and not limitation, it shall be assumed that a Flexsphere process is used as described herein.

Figure 3:
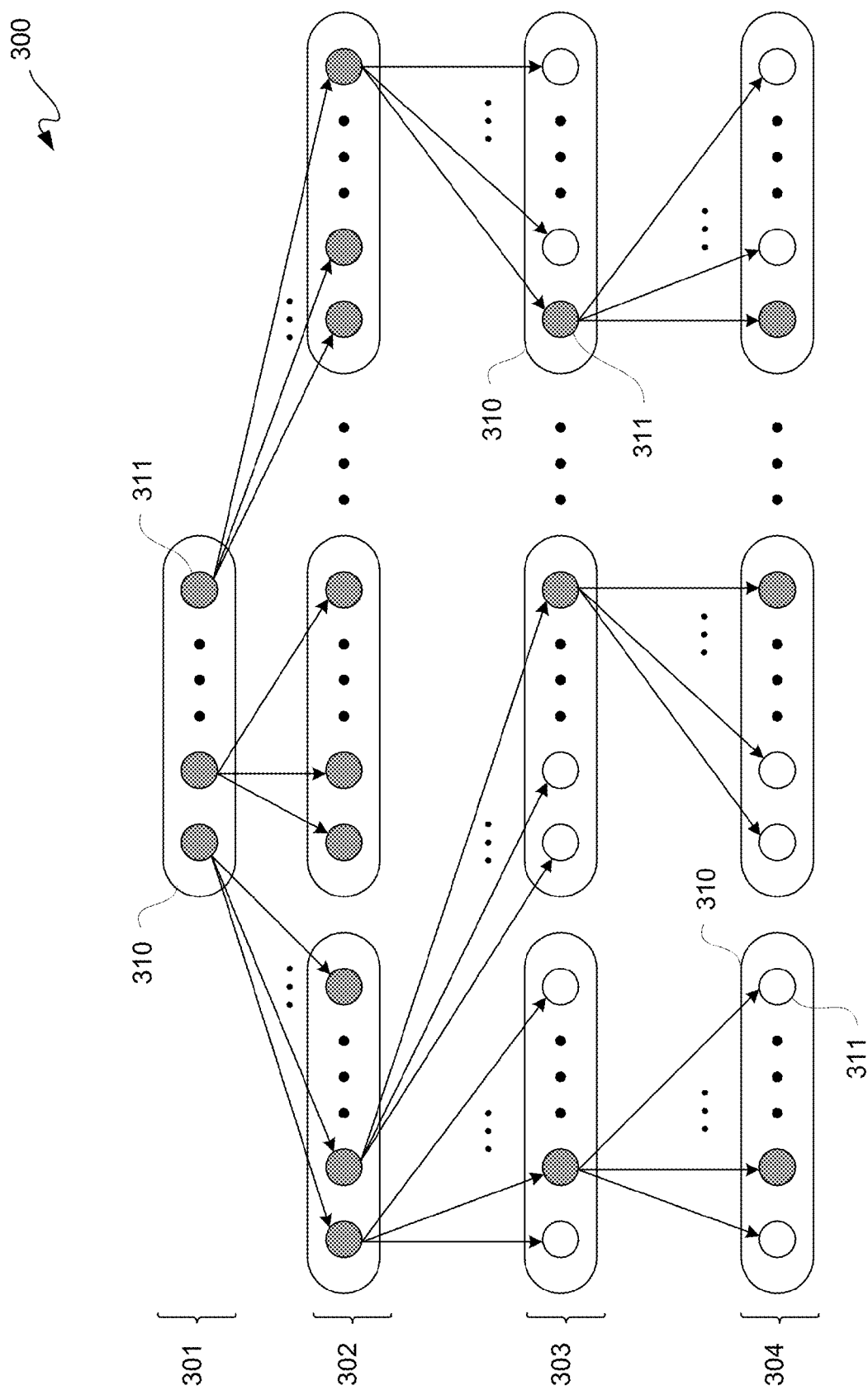
FIG. 3 is a tree diagram depicting an exemplary embodiment of a "Flexsphere" data flow or tree.

FIG. 3 is a tree diagram depicting an exemplary embodiment of a Flexsphere data flow or tree 300. Data flow 300 is an example of a search process for a two-by-two 16-QAM MIMO communication system; however, it should be understood that other channel sizes and/or other constellation sizes of a MIMO communication system may be used.

It should be understood that in levels 301 and 302, respectively for i=3 and i=2 in this example, all branches are kept, as generally indicated with all circles 311 in associated nodes 310 being shaded. In other words, for a Flexsphere process, all branches in the first two levels of a tree are fully expanded. However, subsequent levels, such as levels 303 and 304 of tree 300, are evaluated for all branches. More particularly, for a Flexsphere process, tree levels subsequent to the first and second levels have all of their branches of each node evaluated, and unlikely branches, namely those with relatively large distances, are pruned or trimmed. Selectivity of such a pruning process may be controlled by how many branches a node keeps during such pruning process. For a Flexsphere process, only the best branch for each node after the first and second levels are kept, as generally indicated by all but one circle 311 not being shaded and one circle 311 being shaded for nodes 310 of levels 303 and 304. All surviving paths at the last level, namely level 304 in this example, of tree 300 are in a candidate list.

With renewed reference to FIG. 2, to generate a candidate list, MIMO detector 207 effectively excludes transmit vectors with relatively large Euclidean distances from symbols of the constellation and searches for transmit vectors with relatively small Euclidean distances from such symbols. Because R is an upper triangular matrix, a detector can evaluate clipping distance of a transmit vector level by level. Thus, the above described Flexsphere process may be viewed as a transversal through tree 300. It should be understood that a K-best process and variants thereof, including a Flexsphere process, is a breath-first tree transversal process. However, even though a breath-first tree transversal process is described herein for purposes of clarity by way of example, in other embodiments a depth-first tree transversal process may be used for sphere detection.

Channel reorder and decomposition block 201-1 receives set 0 signal 210-0, which does not cause channel matrix H 111 or symbol vector y 115 to be permutated. However, responsive to set signals 210-1 through 210-M, each of channel reorder and decomposition blocks 201-2 through 201-M permutate channel matrix H 111 and symbol vector 115. This permutation may effectively be a sequential progression of rotating columns of such matrix and rows of such symbol vector such that a different top or initial row of symbol vector y 115 is processed first. In other words, rows of symbol vector y 115 correspond to antennas, such as antennas 101 of FIG. 1, and thus by processing a set of associated row contents of symbol vector y 115 at a time, effectively different channel matrices and symbol vectors are processed each time.

Sequentially rotating columns of channel matrix H 111 and rows of symbol vector y 115 were described for purposes of clarity and not limitation. Rather, it should be understood that content may be read out in any order.

Channel reorder and decomposition blocks 201-1 through 201-M perform decomposition after processing a channel matrix and a symbol vector as previously described. For example, QR decomposition is performed by channel reorder and decomposition blocks 201-2 through 201-M on channel matrix H 111 and symbol vector 115 after permutation thereof by channel reorder and decomposition blocks 201-2 through 201-M. Furthermore, QR decomposition is performed by channel reorder and decomposition block 201-1 without any permutation of channel matrix H 111 and symbol vector 115.

Figure 4:
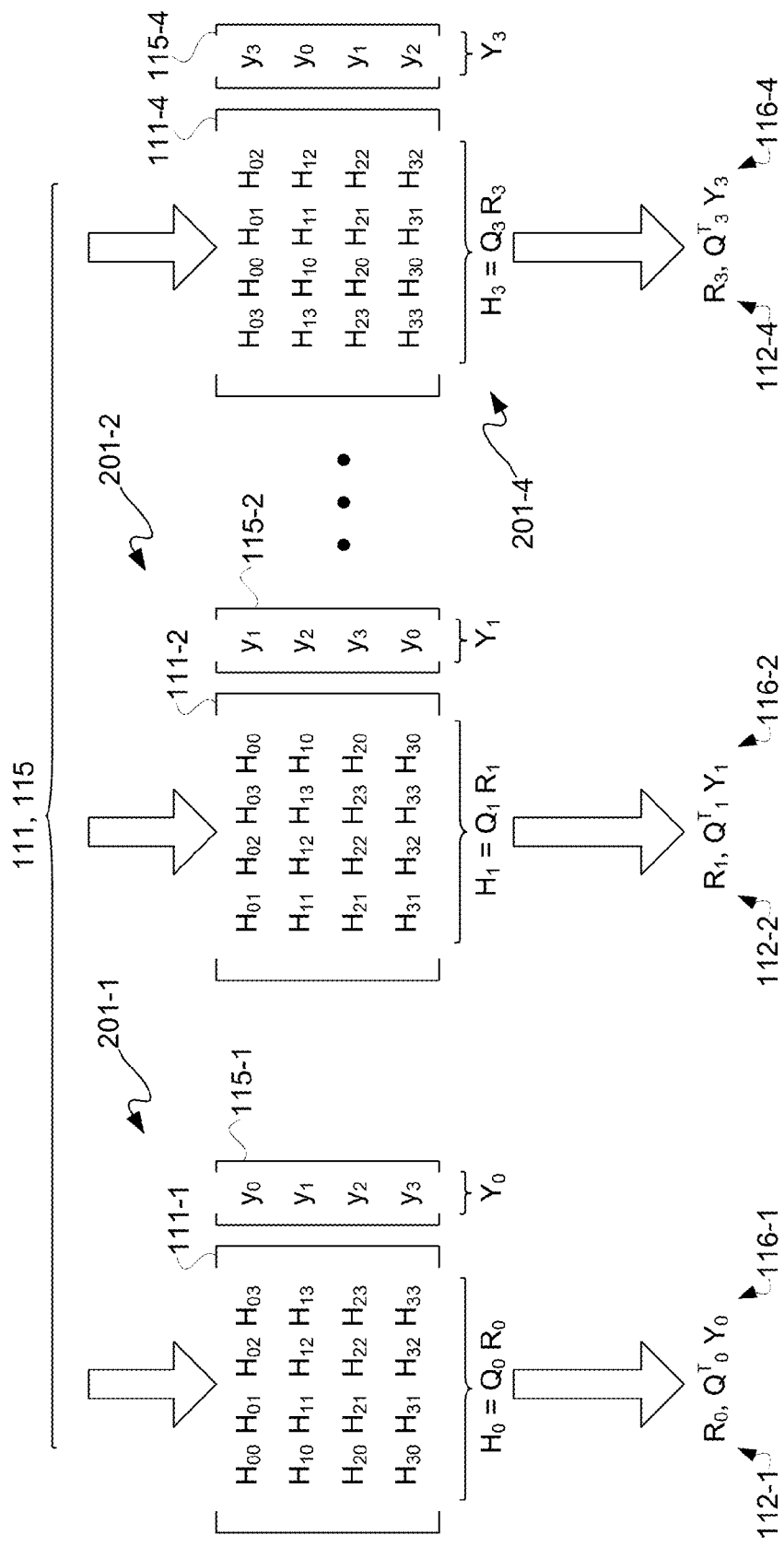
FIG. 4 is a flow diagram depicting an exemplary embodiment of operations of channel reorder and decomposition blocks.

FIG. 4 is a flow diagram depicting an exemplary embodiment of operations of channel reorder and decomposition blocks 201. In this exemplary embodiment, a four-by-four channel matrix H 111 and a four-by-one symbol vector matrix 115 are illustratively depicted; however, it should be understood that matrices of other dimensions may be used.

Channel matrix 111-1 and symbol vector 115-1 are not permutated by channel reorder and decomposition block 201-1 responsive to set 0 signal 210-0. In other words, set 0 means that no permutation is to be performed. As illustratively depicted, channel matrix 111-1 may be composed of rows [$H_{00}$, $H_{01}$, $H_{02}$, $H_{03}$] through [$H_{30}$, $H_{31}$, $H_{32}$, $H_{33}$], and may be described as $H_0 = Q_0 R_0$. Symbol vector y 115-1 may be composed of rows [$y_0$, $y_1$, $y_2$, $y_3$], which may be described as $Y_0$. Accordingly, a QR decomposition by such a portion of channel reorder and decomposition block 201-1 may result in $R_0$ and $Q^T_0 Y_0$ as outputs from channel reorder and decomposition block 201-1, which in this parallelized embodiment are outputs 112-1 and 116-1, respectively. It should be understood that the column subscript number for a channel matrix H denotes a transmitter antenna number and the row subscript number for such channel matrix H denotes a receiver antenna number.

Channel matrix 111-2 and symbol vector 115-2 are permutations of channel matrix H 111 and symbol vector y 115, respectively, by channel reorder and decomposition block 201-2 responsive to sets 1 signal 210-1. As illustratively depicted, channel matrix 111-2 may be permutated by rotation of columns, such that an initial or top row is [$H_{01}$, $H_{02}$, $H_{03}$, $H_{00}$]. Such a permutated channel matrix 111-2 may be described as $H_1 = Q_1 R_1$. Likewise, symbol vector 115-2 may be permutated by rotation of rows, such that a top row is $y_1$, where symbol vector 115-2 may be described as $Y_1$, where the column of symbol vector 115-2 from top-to-bottom order is $y_1$, $y_2$, $y_3$, $y_4$. Accordingly, a QR decomposition by such a portion of channel reorder and decomposition block 201-2 may result in $R_1$ and $Q^T_1 Y_1$ as outputs from channel reorder and decomposition block 201-2, which in this parallelized embodiment are outputs 112-2 and 116-2, respectively.

Such permutations may successively proceed by rotating rows such that a different top row is provided for all such channel matrices, such as channel matrices 111-2 through 111-4. Thus, for a last detection path in this exemplary embodiment, channel matrix 111-4 and symbol vector 115-4 are permutations of channel matrix H 111 and symbol vector 115, respectively, by channel reorder and decomposition block 201-4 responsive to set 3 signal 210-3. As illustratively depicted, channel matrix 111-4 may be permutated by rotation of columns, such that an initial or top row is $[H_{03}, H_{00}, H_{01}, H_{02}]$. Such a permutated channel matrix 111-4 may be described as $H_3 = Q_3 R_3$. Likewise, symbol vector 115-4 may be permutated by rotation of rows, such that a top row is $y_3$, where symbol vector 115-4 may be described as $Y_3$. Accordingly, a QR decomposition by such a portion of channel reorder and decomposition block 201-4 may result in $R_3$ and $Q^T_3 Y_3$ as outputs from channel reorder and decomposition block 201-4, which in this parallelized embodiment are outputs 112-4 and 116-4, respectively.

With reference to outputs 112-1 through 112-4 and 116-1 through 116-4, it should be understood that upper triangular matrix 112 and symbol vector 116 of FIG. 1 have been parallelized, to provide both original and permutated orders as described herein, for providing respective inputs to respective sphere detectors 202.

Again, it should be understood that actual rotation of columns of channel matrix and rows of symbol vector need not occur, but rather content associated channel matrix 111 and symbol vector 115 may be read out in a permutated order. By permutating a channel matrix and a symbol vector as previously described, sublists for bits corresponding to a first antenna level are nonempty, as described below in additional detail, such as for a Flexsphere process.

With renewed reference to FIG. 2, outputs from channel reorder and decomposition blocks 201-1 through 201-M are respectively provided to sphere detectors 202-1 through 202-M. Sphere detectors 202 respectively provide outputs as candidates lists to LLR generator 203. For example, sphere detector 202-1 may provide a candidates list $L^0$ to LLR generator 203, and sphere detector 202-M may provide a candidates list $L^M$ to LLR generator 203.

Again, for a Flexsphere process, two sublists for each bit transmitted by the first antenna level are always nonempty. Thus, there is a complete path through each possible symbol transmitted by the first antenna. Thus, by rotating columns and rows as previously described, each detection path selects a different antenna, such as of antennas 101, as data from such initial antenna to be initially processed. In the exemplary embodiment of FIG. 2 for example, sphere detectors 202 generate candidates lists L independently and in parallel. However, candidate lists generated by sphere detectors 202 are not identical as each $i^{th}$ sphere detector 202 processes an $i^{th}$ antenna first, which ensures that there is at least one path through each of the symbols for such $i^{th}$ antenna. The total number of candidates generated is M multiplied by C, where C is the number of candidates generated by one sphere detector 202.

FIG. 5 is a block diagram depicting an exemplary embodiment of LLR generator 203. LLR generator 203 includes a merge and partition block 501 and LLR engine 502. Optionally, threshold and/or feedback circuitry 503 may be coupled to the output of LLR engine 502.

Candidates lists $L_0$ through $L_M$ are respectively provided from sphere detectors 202-1 through 202-M of FIG. 2 to a merger portion of merge and partition block 501. From merging individual candidates lists $L_0$ through $L_M$ a larger list of sphere detected candidates may be used to generate soft data, such as LLRs which may be computed or otherwise determined by LLR engine 502.

A partition portion of merge and partition block 501 may be used to partition such merged list into two sublists for input to LLR engine 502. For a transmitted bit $x_k$, a merged list of candidates is partitioned into sublists $L_{k,-1}$ and $L_{k,+1}$, and such transmitted bit may be processed as in Equation (1) below. In the following Equation (1), such two sublists are used to compute or otherwise determined an LLR value for $x_k$. In Equation (1), soft-output LLR is given by using a max-Log approximation of a natural log ratio equality of $L_E(x_k|y, H)$ as follows:

$$L_E(x_k \mid y, H) \approx \frac{1}{2} \cdot \min_{x \in L_{k_1 - 1}} \left( \frac{\|y - Hs\|^2}{\sigma_n^2} - \sum_{x_j \in x \setminus x_k} x_j \cdot L_A(j) \right) - \frac{1}{2} \cdot \min_{x \in L_{k_1 + 1}} \left( \frac{\|y - Hs\|^2}{\sigma_n^2} - \sum_{x_j \in x \setminus x_k} x_j \cdot L_A(j) \right) \quad (1)$$

In Equation (1), s is a transmit vector, namely $s = [s_0, s_1, \ldots, s_{N-1}]$; receiver noise n, namely $n = [n_0, n_1, \ldots, n_{N-1}]$, is an independent zero mean circular symmetric complex Gaussian random variable ("ZMCSCG") with $\sigma_n^2$ variance; and $L_A(j)$ are a priori probabilities, which may be set on a receiver side. From Equation (1), it should be appreciated that a soft-output MIMO detection may be divided into two parts, namely a candidate list search and an LLR computation.

In Equation (1), $L_E(x_k|y, H)$ is a per bit soft-output LLR from LLR engine 502. Rather than compute intensive computing of $L_E(x_k|y, H)$ exactly which involves searching through all possible binary vectors, an approximate value of $L_E(x_k|y, H)$ is determined as indicated in Equation (1). A partitioned or separated out candidate list means that minimizations are performed on two sublists instead of the set of all possible transmit vectors. This approximation therefore reduces the complexity of LLR engine 502.

FIG. 6 is a flow diagram depicting an exemplary embodiment of an LLR generation flow 600. A list or lists of candidates are received at 601. In this exemplary embodiment, there are candidates $C_0$ through $C_m$, for m an integer greater than zero. Candidates C may be obtained from sphere detecting as previously described.

Each candidate at 601 may be a value associated with a weight. For purposes of clarity by way of example and not limitation, a 4-bit value as indicated at 602 is associated with each of such candidates obtained at 601, and each of such binary values at 602 may be associated with a weight as indicated at 603. Such binary values may be coded to represent weights, such as Euclidean distances. Even though particular examples are used for binary values and weights for purposes of clarity, it should be appreciated that these or other binary values and weights may be used. It should further be understood that weights 603 may be associated with Euclidean distances from symbols in the constellation. Thus the larger such weights are the less likely they are to represent the symbol from which they are displaced.

For purposes of clarity by way of example and not limitation, only two bits of three candidates' 4-bit values 612 and their associated weights 613 at 602 and 603, respectively, are described.

At 604, weights are put either into a bit zero sublist or a bit one sublist according to associated bits and weights as described below in additional detail. A first bit of each of the 4-bit values 612 is a zero bit, and thus all three weights, namely 3, 2, and 0.1, associated therewith are placed in the bit zero sublist 614 for such first bit. A zero weight may be placed in the bit one sublist 615 for such first bit to indicate an empty set. A second bit of each of the 4-bit values 612 may be evaluated next. In this exemplary embodiment, one second bit is a binary zero and the other two second bits are binary ones. The weight associated with the 4-bit binary value having a second bit with a logic zero is placed in the bit zero sublist 614. The weights associated with the 4-bit binary value having a second bit with a logic one are placed in the bit one sublist 615. The remainder of the bits of the 4-bit binary values and their associated weights may likewise be partitioned into either of sublist 614 or 615, as illustratively depicted.

Sublists 614 and 615 may be output from merge and partition block 501 for input to LLR engine 502 of FIG. 5 for minimization at 605. At 605, sublists 614 and 615 may be minimized respectively into sublists 616 and 617. A minimum value of each set of weights is retained for each position in a sublist. Thus, for example, a set of 3, 2, and 0.1 in sublist 614 is minimized by selecting 0.1 and pruning the other weights, namely 3 and 2. Thus, in this example a 0.1 is retained in such position in forming sublist 616, namely such minimum weight of a set is retained in sublist 616 in a corresponding position to such weight in sublist 614.

Even though a sublist 614 or 615 may have an empty set in a position, it will not have to empty sets in a corresponding position in accordance with Flexsphere detection due to combining sublists by subtraction as indicated in Equation (1). At 606, sublist 617 is subtracted from sublist 616 to produce an LLR value for output, and as only one position of two corresponding positions in two sublists may be an empty set, LLR values 618 output are all nonempty. At 606, sublist 617 is subtracted from sublist 616 to produce a list of LLRs 618. LLRs 618 represent Euclidean distances, as previously described. Thus, approximations of $L_E(x_k|y, H)$ may be output by LLR engine 502 of FIG. 5 as described herein.

Figure 7:
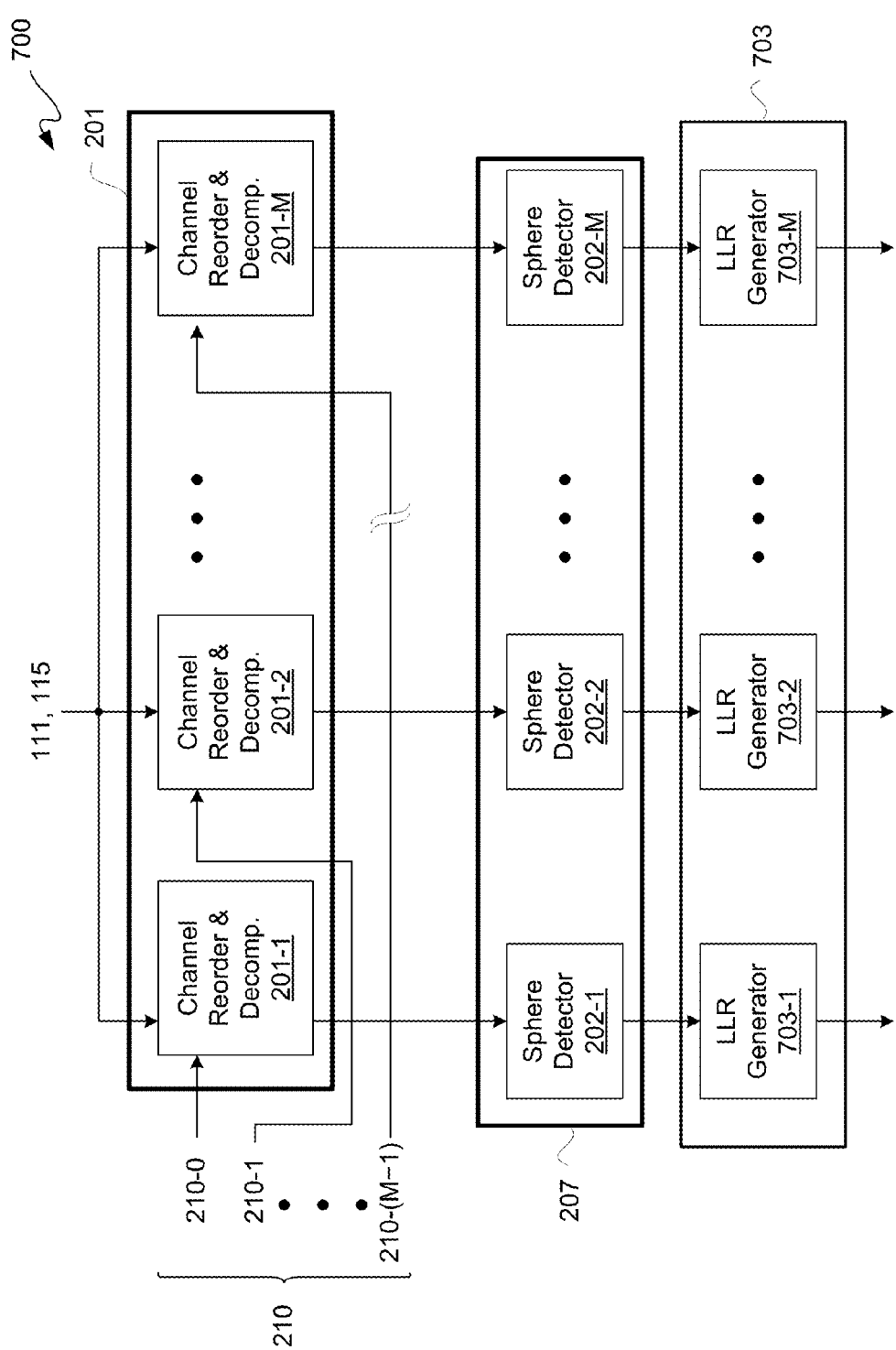
FIG. 7 is a block diagram depicting an exemplary embodiment of a parallel detection path MIMO detector system without merger of candidate lists.

FIG. 7 is a block diagram depicting an exemplary embodiment of a parallel detection path MIMO detector system. 700. MIMO detector system 700 is similar to MIMO detector system 200 of FIG. 2, except that reliability information generator 703 is composed of a plurality of LLR generators, namely LLR generators 703-1 through 703-M ("703"). LLR generators 703-1 through 703-M are respectively coupled to receive outputs from sphere detectors 202-1 through 202-M. Thus, rather than a merged list of candidates, individual lists of candidates from respective sphere detectors 202 are processed by respective LLR generators 703. Such LLR generators 703 output respective lists of LLRs. Thus, in contrast to MIMO detector system 200, MIMO detector system 700 is without or does not employ merger of candidate lists to produce soft data.

Figure 8:
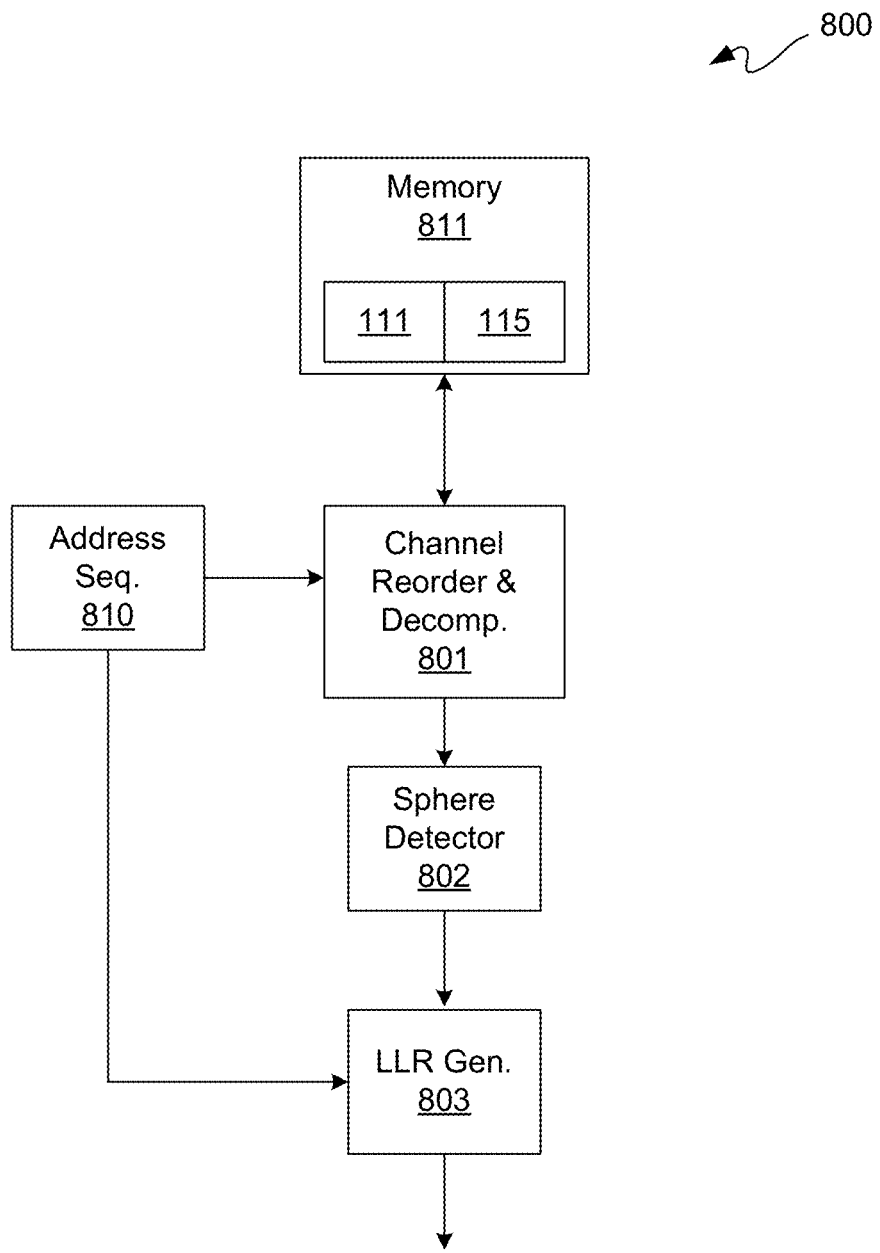
FIG. 8 is a block diagram depicting an exemplary embodiment of an iterative MIMO detector system.

FIG. 8 is a block diagram depicting an exemplary embodiment of a serial MIMO detector system 800. MIMO detector system 800 includes address sequencer 810, memory 811, channel reorder and decomposition block 801, sphere detector 802, and LLR generator 803. Memory 811, channel reorder and decomposition block 801, sphere detector 802, and LLR generator 803 may be coupled in a series that order. Address sequencer 810 may be coupled to provide addresses to channel reorder and decomposition block 801 and LLR generator 803. Each address provided from address sequencer 810 to channel reorder & decomposition block 801 may be used to read out a different initial row corresponding to a different receive antenna. In other words, a channel matrix H 111 and a symbol vector y 115 may be read out of memory 811 in a permutated order as previously described but serially rather than in parallel.

It should be understood that columns or rows of a matrix or vector may not actually be rotated or otherwise permutated as stored. Rather, such matrix or vector may be stored in memory 811 in an original condition. However, content from such matrix or vector may be read out in an original order sequence or a permutated order sequence.

Figure 9:
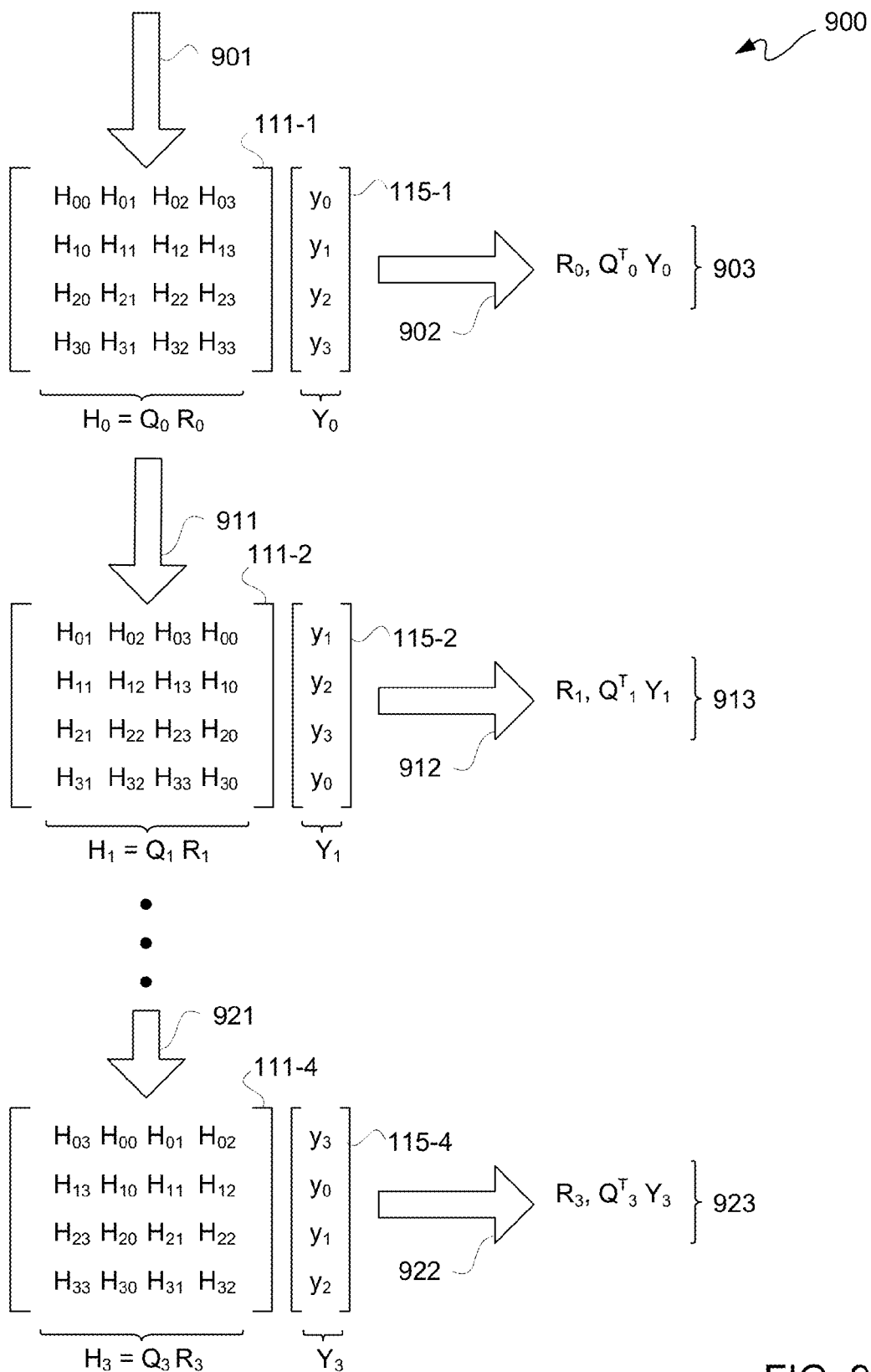
FIG. 9 is a flow diagram depicting an exemplary embodiment of a serial reordering and decomposition flow.

FIG. 9 is a flow diagram depicting an exemplary embodiment of a serial reordering and decomposition flow 900. Continuing the example of a four-by-four channel matrix and a four-by-one symbol vector, serial reordering and decomposition flow 900 is further described with simultaneous reference to FIG. 8. Again, it should be understood that other channel sizes may be used.

At 901, a channel matrix 111-1 and a symbol vector 115-1 are read by channel reorder and decomposition block 801 from memory 811 in an original order responsive to address information provided by address sequencer 810. At 902, a QR decomposition is performed by channel reorder and decomposition block 801 on such channel matrix and symbol vector read at 901. A result from such QR decomposition may be output at 903. Such output at 903 may be provided to sphere detector 802. Register stage control (not shown for purposes of clarity and not limitation) may be used to control output from channel reorder and decomposition block 801 to sphere detector 802. Furthermore, another register stage control (not shown for purposes of clarity and not limitation) may be used to control output from sphere detector 802 to LLR generator 803.

Sphere detector 802 may process output obtained at 903 as previously described herein for providing a candidates list to LLR generator 803. Sometime later at 911, channel matrix 111-2 and a symbol vector 115-2 are read by channel reorder and decomposition block 801 from memory 811 in a permutated order, such as previously described herein, responsive to address information from address sequencer 810. Accordingly, it should be appreciated that for each iteration of channel reordering different address information may be provided by address sequencer 810.

At 912, a QR decomposition is performed by channel reorder and decomposition block 801 on such permutated channel matrix and permutated symbol vector read at 911. A result from such QR decomposition may be output at 913. Such output at 913 may be provided to sphere detector 802 for subsequent processing as previously described herein.

Lastly, for a last of a sequence of permutations for the exemplary embodiment of FIG. 9, at 921 channel matrix 111-4 and a symbol vector 115-4 are read by channel reorder and decomposition block 801 from memory 811 in a permutated order responsive to address information from address sequencer 810. At 922, a QR decomposition is performed by channel reorder and decomposition block 801 on such channel matrix and symbol vector read at 921. A result from such QR decomposition is output at 923. Such outputs at 923 may be provided to sphere detector 802 for subsequent processing as previously described herein.

Address sequencer 810 may be coupled to LLR generator 803 in order to delineate when a complete sequence of addresses for a permutation cycle has finished. LLR generator 803 may wait to accumulate all candidate lists for merger and subsequent processing as previously described herein. In another embodiment, LLR generator 803 may immediately process each candidate list as received with subsequent candidate lists being concatenated to an existing in process candidate lists for a sequence of addresses. Accordingly, LLR generator 803 may output partial LLRs while in the process of processing a sequence of addresses or may wait until a complete list of LLRs is ready for output.

Figure 10:
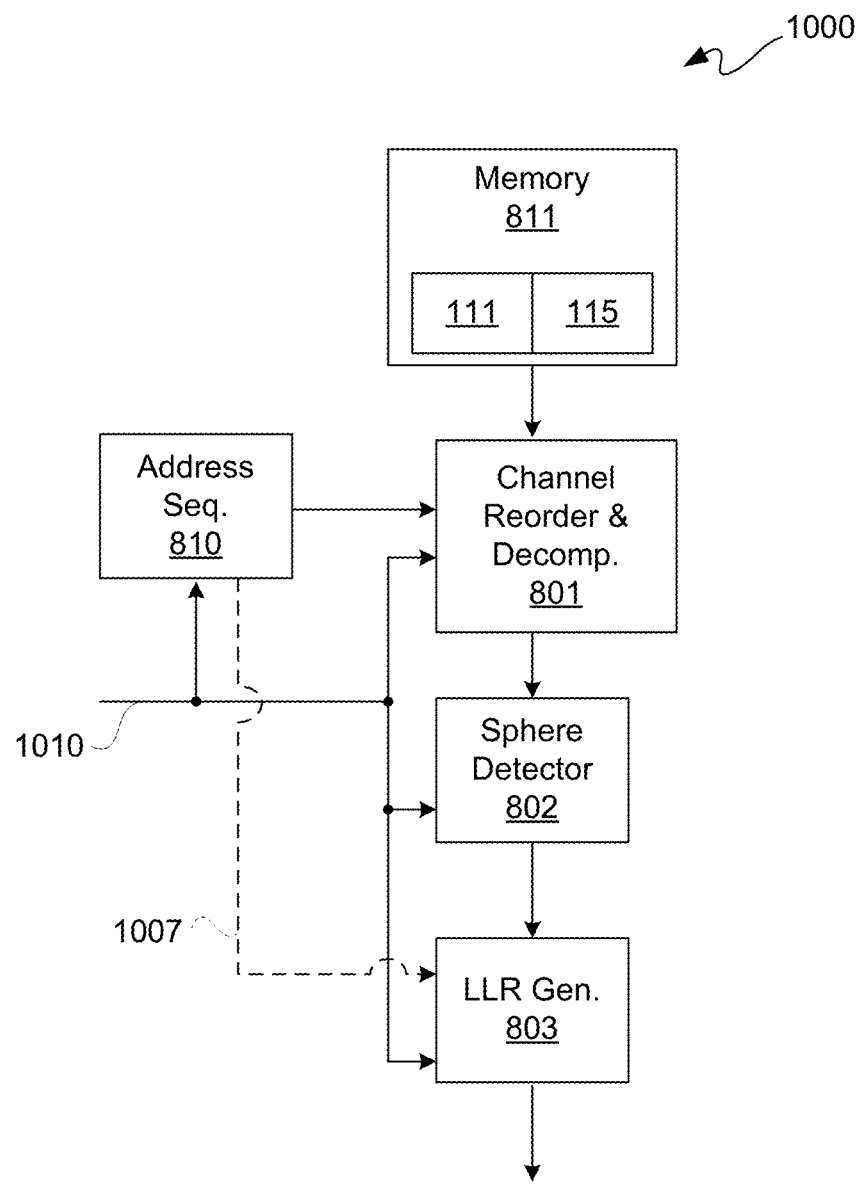
FIG. 10 is a block diagram depicting an exemplary embodiment of a pipeline MIMO detector system.

FIG. 10 is a block diagram depicting an exemplary embodiment of a pipeline MIMO detector system 1000. Pipeline MIMO detector system 1000 is similar to iterative MIMO detector system 800 of FIG. 8, except for the following differences. Address sequencer 810, channel reorder and decomposition block 801, sphere detector 802, and LLR generator 803 are all clocked responsive to clock signal 1010 for pipelined operation. Again, register control stages are not illustratively depicted for purposes of clarity and not limitation. Furthermore, address sequencer 810 may optionally be coupled to LLR generator 803, as generally indicated by dashed line 1007, for indicating a completion of an address sequence for a permutation cycle. However, in another embodiment, partial LLRs may be output on each clock cycle of a permutation cycle.

Figure 11:
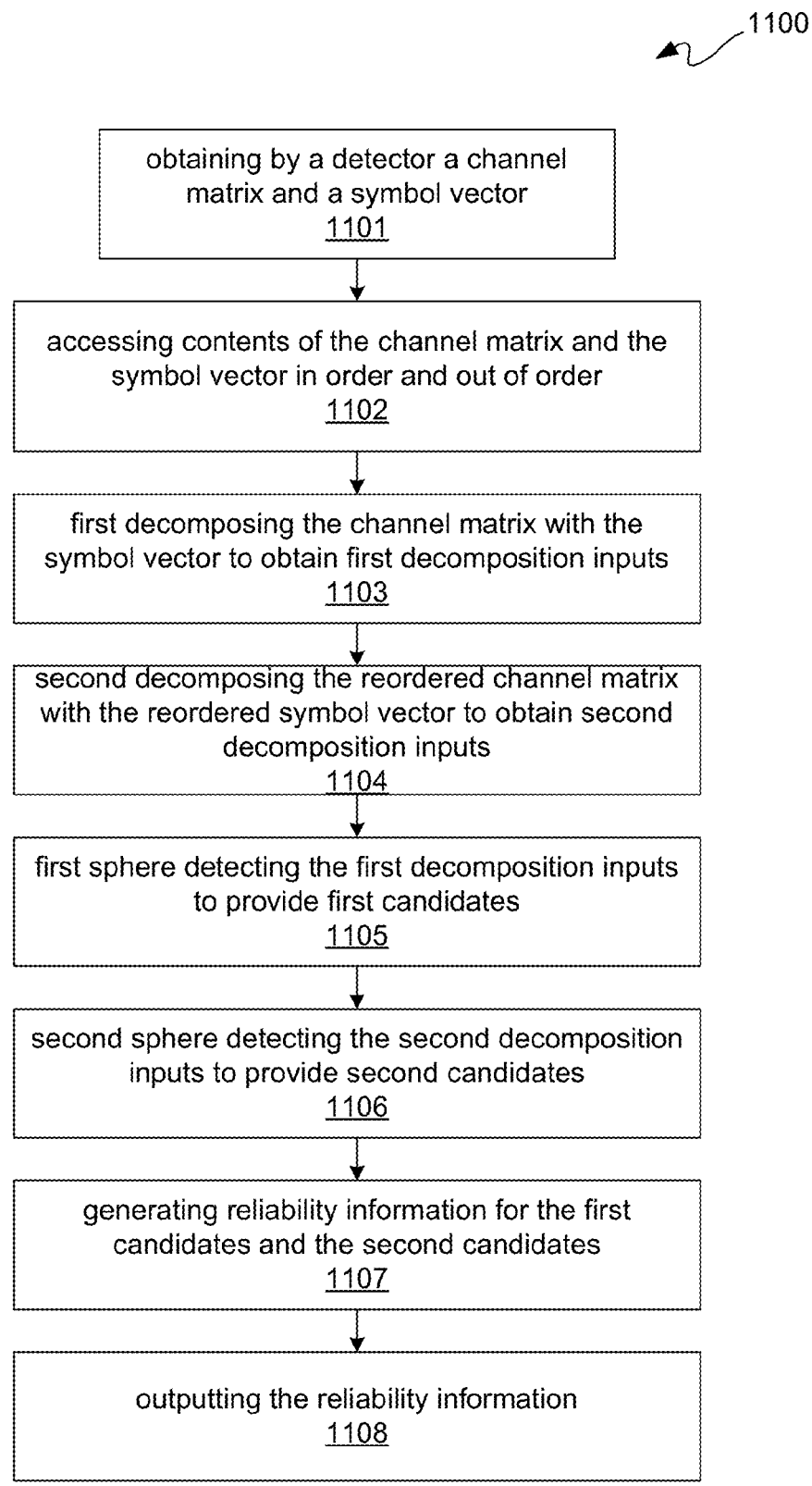
FIG. 11 is a flow diagram depicting an exemplary embodiment of a multiple-antenna receiver flow.

FIG. 11 is a flow diagram depicting an exemplary embodiment of a multiple-antenna receiver flow 1100. At 1101, a detector obtains a channel matrix and a symbol vector. At 1102, contents of the channel matrix and symbol vector obtained at 1101 are accessed. Such accessing of contents includes both in order and out of order accessing, as previously described with reference to permutations of such channel matrix and symbol vector. It should further be understood that this accessing may occur in parallel or serially as described elsewhere herein. Additionally, it should be understood that effectively out of order access of contents of a channel matrix and a symbol vector may provide a reorder channel matrix and a reorder symbol vector, respectively.

At 1103, a channel matrix and a symbol vector, which are accessed in order at 1102, are decomposed, such as by QR decomposition for example, to obtain a set of decomposition inputs. At 1104, a reordered channel matrix and a reordered symbol vector, which are obtained by an out of order access at 1102, are decomposed, such as by QR decomposition for example, to obtain another set of decomposition inputs. It should be understood that decomposition at 1103 and 1104 may be performed in parallel or serially as described elsewhere herein. It should further be understood that it is not necessary to start processing with an in order access of a channel matrix and a symbol vector for serial processing as described herein, as an out of order or permuted order may be used prior to an original order for such serial processing.

At 1105, the set of decomposition inputs obtained at 1103 are sphere detected to provide a list of candidates. At 1106, the set of decomposition inputs obtained at 1104 are sphere detected to provide another list of candidates. It should be understood that sphere detecting at 1105 and 1106 may be performed in parallel or serially as previously described elsewhere herein. For serial processing, it should further be understood that decomposing at 1104 may be performed while performing sphere detecting at 1105. Such serial processing includes pipelined processing.

At 1107, reliability information for the lists of candidates provided at 1105 and 1106 is generated. As previously described herein, such lists of candidates may be merged for processing to obtain such reliability information. Furthermore, in another embodiment as previously described herein, such lists of candidates may be individually processed, namely without such merger, to obtain such reliability information. It should however be understood that the reliability information output in these two embodiments may not be equivalent. More particularly, reliability information obtained from a merged list of candidates may be more accurate than reliability information obtained without such merger. Furthermore, such reliability information may be generated in parallel or serially, including without limitation generation of partial lists of reliability information. As previously described herein, such reliability information may be soft data, such as LLRs for example. At 1108, such reliability information generated at 1107 may be output, such as for receipt by a decoder.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 12:
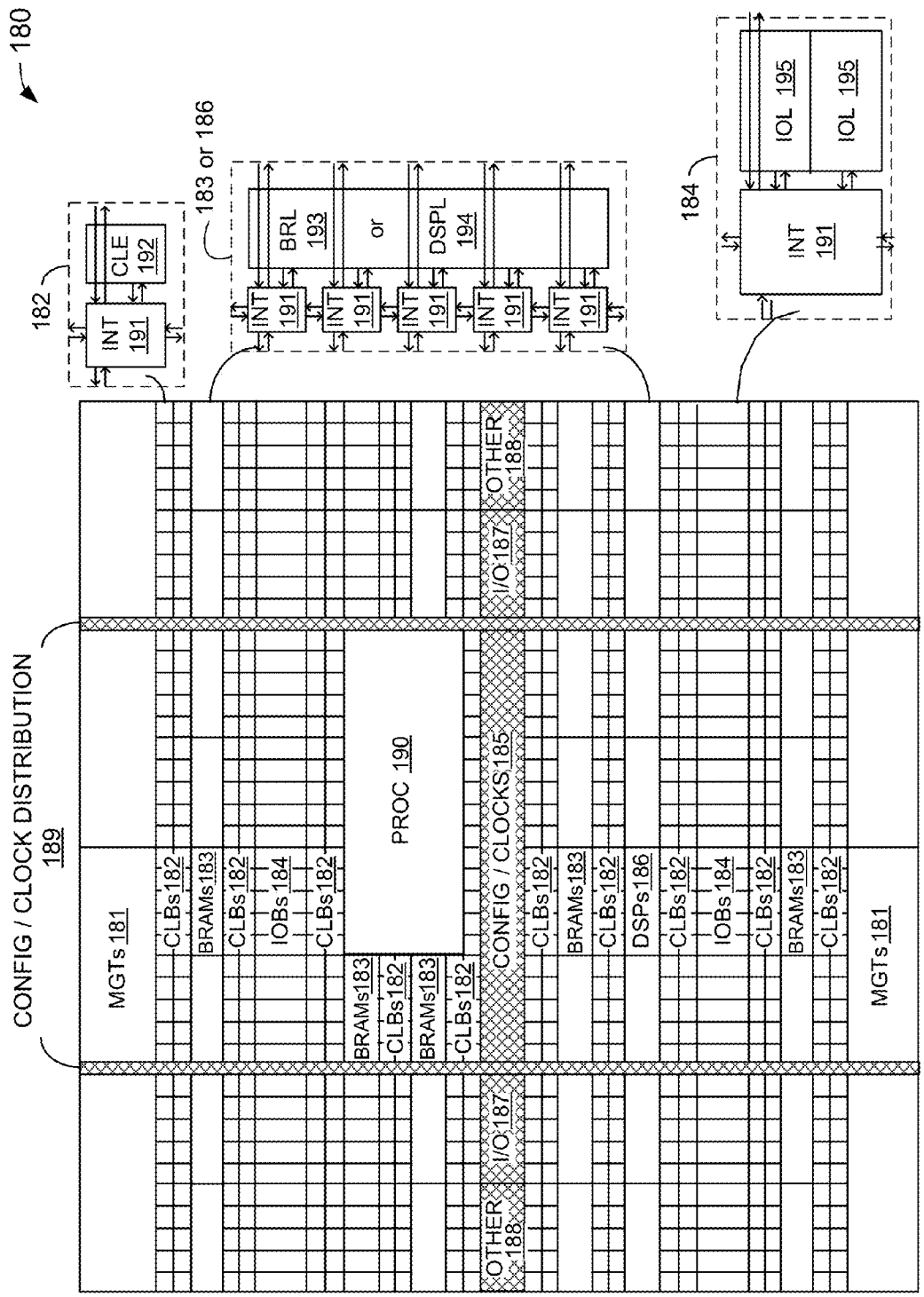
FIG. 12 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 12 illustrates an FPGA architecture 180 that includes a large number of different programmable tiles including multi-gigabit transceivers ("MGTs") 181, configurable logic blocks ("CLBs") 182, random access memory blocks ("BRAMs") 183, input/output blocks ("IOBs") 184, configuration and clocking logic ("CONFIG/CLOCKS") 185, digital signal processing blocks ("DSPs") 186, specialized input/output blocks ("I/O") 187 (e.g., configuration ports and clock ports), and other programmable logic 188 such as digital clock managers, analog-to-digital converters, system monitoring logic, and so forth. Some FPGAs also include dedicated processor blocks ("PROC") 190.

In some FPGAs, each programmable tile includes a programmable interconnect element ("INT") 191 having standardized connections to and from a corresponding interconnect element in each adjacent tile. Therefore, the programmable interconnect elements taken together implement the programmable interconnect structure for the illustrated FPGA. The programmable interconnect element 191 also includes the connections to and from the programmable logic element within the same tile, as shown by the examples included at the top of FIG. 12.

For example, a CLB 182 can include a configurable logic element ("CLE") 192 that can be programmed to implement user logic plus a single programmable interconnect element ("INT") 191. A BRAM 183 can include a BRAM logic element ("BRL") 193 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 186 can include a DSP logic element ("DSPL") 194 in addition to an appropriate number of programmable interconnect elements. An 10B 184 can include, for example, two instances of an input/output logic element ("IOL") 195 in addition to one instance of the programmable interconnect element 191. As will be clear to those of skill in the art, the actual I/O pads connected, for example, to the I/O logic element 195 typically are not confined to the area of the input/output logic element 195.

In the pictured embodiment, a horizontal area near the center of the die (shown in FIG. 12) is used for configuration, clock, and other control logic. Vertical columns 189 extending from this column are used to distribute the clocks and configuration signals across the breadth of the FPGA.

Some FPGAs utilizing the architecture illustrated in FIG. 12 include additional logic blocks that disrupt the regular columnar structure making up a large part of the FPGA. The additional logic blocks can be programmable blocks and/or dedicated logic. For example, processor block 190 spans several columns of CLBs and BRAMs.

Note that FIG. 12 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 12 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

A MIMO detector system, including some or all of the resources thereof, such as any of the embodiments of MIMO detector systems 200, 700, 800, and/or 1000 described herein, may be implemented in hardware as an ASIC or an ASSP, or in a PLD, such as an FPGA 180 using DSP tiles 186, among other resources thereof.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A method for a multiple-antenna receiver, comprising:
    obtaining by a detector a channel matrix and a symbol vector;
    accessing contents of the channel matrix and the symbol vector in order and out of order;
    wherein the out of order access of the contents of the channel matrix and the symbol vector respectively provide a reordered channel matrix and a reordered symbol vector;
    first decomposing the channel matrix with the symbol vector to obtain first decomposition inputs;
    second decomposing the reordered channel matrix with the reordered symbol vector to obtain second decomposition inputs;
    first sphere detecting the first decomposition inputs to provide first candidates;
    second sphere detecting the second decomposition inputs to provide second candidates;
    generating reliability information from the first candidates and the second candidates;
    wherein the generating of the reliability information from the first candidates and the second candidates includes partitioning the first candidates and the second candidates to provide a plurality of lists thereof; and
    outputting the reliability information.

2. The method according to claim 1, wherein:
    the first decomposing and the second decomposing are performed in parallel with respect to one another; and
    the first sphere detecting and the second sphere detecting are performed in parallel with respect to one another.

3. The method according to claim 2, wherein the generating of the reliability information from the first candidates and the second candidates includes:
    merging the first candidates and the second candidates to provide a merged list;
    partitioning the merged list into sub-lists to provide the plurality of lists;
    trimming the sub-lists to minimum weights; and
    subtracting the sub-lists one from another to obtain log-likelihood ratios as the reliability information.

4. The method according to claim 2, wherein;
    the plurality of lists includes first lists and second lists; and
    the generating of the reliability information from the first candidates and the second candidates includes:
        partitioning the first candidates into the first lists;
        partitioning the second candidates into the second lists;
        trimming the first lists to first minimum weights;
        trimming the second lists to second minimum weights;
        subtracting the first lists one from another to obtain first log-likelihood ratios as the reliability information portion associated with the first candidates; and
        subtracting the second lists one from another to obtain second log-likelihood ratios as the reliability information portion associated with the second candidates.

5. The method according to claim 1, wherein:
the first decomposing and the first sphere detecting provide a first sequence used to provide the first candidates and are followed by a second sequence of the second decomposing and the second sphere detecting to provide the second candidates.

6. The method according to claim 5, further comprising:
clocking the accessing, the first decomposing, the first sphere detecting, the second decomposing, the second sphere detecting, and the generating for pipelined processing.

7. The method according to claim 6, wherein the generating includes merging the first candidates and the second candidates into a single list.

8. A detector system, comprising:
channel reordering and decomposing circuits each coupled to receive a channel matrix and a symbol vector as inputs;
the channel reordering and decomposing circuits respectively coupled to receive control signals;
sphere detectors respectively coupled to receive outputs from the channel reordering and decomposing circuits to respectively generate lists of candidates; and
a reliability information generator coupled to receive the lists of candidates for generating reliability information associated with symbols of a constellation;
wherein:
a subset of the control signals are for out of order accessing of contents of the channel matrix and the symbol vector;
a subset of the channel reordering and decomposing circuits generate reordered channel matrices different from one another and reordered symbol vectors different from one another; and
the reordered channel matrices and the reordered symbol vectors are respectively decomposed by the subset of the channel reordering and decomposing circuits to provide respective sets of inputs for an associated subset of the sphere detectors.

9. The detector system according to claim 8, wherein:
a channel reordering and decomposing circuit not of the channel reordering and decomposing circuits coupled to receive a control signal of the control signals for in order accessing of the contents of the channel matrix and the symbol vector; and
the channel reordering and decomposing circuit uses the channel matrix and the symbol vector for decomposition to provide a set of inputs for an associated sphere detector of the sphere detectors.

10. The detector system according to claim 9, wherein:
the reliability information generator is configured to merge the lists of candidates to provide a candidates list, to partition the candidates list on a bit-by-bit basis for weights associated therewith to provide partitioned lists, to minimize the weights of the partitioned lists; and to subtract the partitioned lists one from another to generate log likelihood ratio values.

11. The detector system according to claim 9, wherein:
the reliability information generator is a grouping of log likelihood ratio generators respectively associated with the sphere detectors and coupled to respectively receive the lists of candidates; and
each of the log likelihood generators is configured to process an associated candidates list of the lists of candidates by partitioning the associated candidates list on a bit-by-bit basis for weights associated therewith to provide partitioned lists, to minimize the weights of the partitioned lists; and to subtract the partitioned lists one from another to generate log likelihood ratio values.

12. A communication system including the detector system of claim 10, the communication system further including:
antennas to receive orthogonal frequency division multiplexed ("OFDM") signals;
a receiver coupled to the antennas and configured to provide the symbol vector responsive to the OFDM signals received; and
a channel estimator coupled to the receiver to provide the channel matrix;
wherein the detector system includes:
a decomposer coupled to receive the channel matrix and configured to provide a unitary matrix responsive to decomposition of the channel matrix and coupled to provide the unitary matrix to the detector;
a transpose circuit coupled to receive the unitary matrix and configured to provide a transposed matrix of the unitary matrix;
a multiplier coupled to multiply the symbol vector and the transposed matrix to provide another symbol vector to the detector; and
a decoder coupled to receive the log likelihood ratio values.

13. A communication system including the detector system of claim 11, the communication system further including:
antennas to receive orthogonal frequency division multiplexed ("OFDM") signals;
a receiver coupled to the antennas and configured to provide the symbol vector responsive to the OFDM signals received; and
a channel estimator coupled to the receiver to provide the channel matrix;
wherein the detector system includes:
a decomposer coupled to receive the channel matrix and configured to provide a unitary matrix responsive to decomposition of the channel matrix and coupled to provide the unitary matrix to the detector;
a transpose circuit coupled to receive the unitary matrix and configured to provide a transposed matrix of the unitary matrix;
a multiplier coupled to multiply the received vector and the transposed matrix to provide the symbol vector; and
a decoder coupled to receive the log likelihood ratio values.

14. A detector system, comprising:
a channel reordering and decomposing circuit coupled to receive a channel matrix and a symbol vector as inputs;
an address sequencer coupled to the channel reordering and decomposing circuit to provide a sequence of addresses thereto;
a sphere detector coupled to receive output from the channel reordering and decomposing circuit to generate a list of candidates; and
a reliability information generator coupled to receive the list of candidates for generating reliability information associated with symbols of a constellation;
wherein:
a subset of the sequence of addresses is for out of order accessing of contents of the channel matrix and the symbol vector;
the channel reordering and decomposing circuit generates reordered channel matrices different from one another and reordered symbol vectors different from one another responsive to the subset of the sequence of addresses; and the reordered channel matrices and the reordered symbol vectors are respectively decomposed by the channel reordering and decomposing circuit to provide respective sets of inputs for the sphere detector.

15. The detector system according to claim 14, wherein:
an address of the sequence of addresses is for in order accessing of the contents of the channel matrix and the symbol vector; and
the channel reordering and decomposing circuit uses the channel matrix and the symbol vector for decomposition to provide a set of inputs for the sphere detector.

16. The detector system according to claim 15, wherein:
the reliability information generator is a log likelihood ratio generator; and
the log likelihood generator is configured to process the list of candidates list on a bit-by-bit basis for weights associated therewith to provide partitioned lists, to minimize the weights of the partitioned lists; and to subtract the partitioned lists one from another to generate log likelihood ratio values.

17. The detector system according to claim 15, wherein the channel reordering and decomposing circuit, the address sequencer, the sphere detector, and the reliability information are all clocked for pipelined processing.

18. A communication system including the detector system of claim 15, the communication system further including:
antennas to receive orthogonal frequency division multiplexed ("OFDM") signals;
a receiver coupled to the antennas and configured to provide a received vector responsive to the OFDM signals received; and
a channel estimator coupled to the receiver to provide the channel matrix;
wherein the detector system includes:
a decomposer coupled to receive the channel matrix and configured to provide a unitary matrix responsive to decomposition of the channel matrix;
a transpose circuit coupled to receive the unitary matrix and configured to provide a transposed matrix of the unitary matrix;
a multiplier coupled to multiply the received vector and the transposed matrix to provide the symbol vector; and
a decoder coupled to receive the log likelihood ratio values.

* * * * *